(12) United States Patent  
Venton et al.

(10) Patent No.: US 12,001,774 B2  
(45) Date of Patent: Jun. 4, 2024

(54) METHOD TO CURE ANTENNA VIOLATIONS IN CLOCK NETWORK USING JUMPERS

(71) Applicant: International Business Machines Corporation, Armonk, NY (US)

(72) Inventors: Amanda Christine Venton, Austin, TX (US); Peter Milton Nasveschuk, Yarmouth, ME (US); Christopher Joseph Berry, Red Hook, NY (US); Eric Chien Lai, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 17/392,341

(22) Filed: Aug. 3, 2021

(65) Prior Publication Data

US 2023/0038856 A1 Feb. 9, 2023

(51) Int. Cl.
*G06F 30/398* (2020.01)
*H01Q 1/22* (2006.01)

(52) U.S. Cl.
CPC ......... *G06F 30/398* (2020.01); *H01Q 1/2283* (2013.01)

(58) Field of Classification Search
CPC ......... G06F 16/955; G06F 2009/45591; G06F 7/588; G06F 8/71; G06F 9/45545; G06F 9/4555; G06F 9/45558; G06F 2009/45595; G06F 7/58; G06F 9/4881; G06F 16/9566; G06F 16/909; G06F 16/9558; G06F 9/547; G06F 16/9574; G06F 13/107; G06F 13/4282; G06F 21/56; G06F 21/82; G06F 2213/0008; G06F 2213/0024; G06F 2213/0028; G06F 2213/0032; G06F 2213/0036; G06F 2213/0042; G06F 9/45504; G06F 3/0219; G06F 3/0233; G06F 3/0237; G06F 3/0238; G06F 11/3006;
(Continued)

(56) References Cited

U.S. PATENT DOCUMENTS 6,502,225 B2 12/2002 Ishikura
6,792,578 B1 9/2004 Brown et al.
(Continued)

FOREIGN PATENT DOCUMENTS

WO 2016060544 A1 4/2016

OTHER PUBLICATIONS

Su et al., "An optimal jumper insertion algorithm for antenna avoidance/fixing on general routing trees with obstacles." Proceedings of the 2006 international symposium on Physical design. (2006): 8 pages.

*Primary Examiner* — Binh C Tat
(74) *Attorney, Agent, or Firm* — CANTOR COLBURN LLP; Kelsey Skodje

(57) ABSTRACT

A method for curing antenna violations on an integrated circuit that includes multiple levels includes: obtaining a design of a circuit, the design including a first element connected to first device and a second element connected to one or more second devices, wherein the first and second elements both receive a common signal; determining that an antenna violation exists in on the first element at a first level of the multiple levels; and modifying the design of the circuit to add a connected between the first element and the second element at the first layer or at a layer below the first layer.

13 Claims, 8 Drawing Sheets

(58) Field of Classification Search
CPC ............. G06F 11/3027; G06F 11/3051; G06F 18/217; G06F 3/013; G06F 30/398; G06F 40/30; G06F 1/1601; G06F 1/1626; G06F 1/1632; G06F 1/1643; G06F 1/1673; G06F 1/1684; G06F 1/169; G06F 1/3231; G06F 2200/1637; G06F 3/016; G06F 3/017; G06F 3/046; G06F 3/0482; G06F 3/0488; G06F 3/04883; G06F 30/36; G06F 30/394; G06F 40/216; G06F 40/284; G06F 8/65; G06F 9/452; G06F 9/54; G06F 9/543; G06F 16/90332; G06F 40/247; G06F 9/451; G06F 30/396; G06F 2113/10; G06F 30/27; G06F 16/27; G06F 16/182; G06F 16/24544; G06F 16/2455; G06F 16/24552; G06F 16/2456; G06F 16/2462; G06F 16/2471; G06F 16/278; G06F 9/5044; G06F 9/5055; G06F 21/35; G06F 3/147; G06F 16/24537; G06F 16/958; G06F 21/31; G06F 2221/2149; G06F 3/04842; G06F 3/0487; G06F 3/1423; G06F 9/455; H04L 63/164; H04L 67/2885; H04L 69/325; H04L 69/326; H04L 69/329; H04L 69/40; H04L 67/06; H04L 63/168; H04L 63/1466; H01L 27/0207; H01L 2223/6677; H01L 31/042; H01L 27/0255; H01Q 1/2283

USPC .................................................. 716/110–118

See application file for complete search history.

(56) References Cited

U.S. PATENT DOCUMENTS

| | | | |
|---|---|---|---|
| 7,073,148 B1 * | 7/2006 | Jenkins | G06F 30/398 716/112 |
| 7,302,662 B2 | 11/2007 | Lee et al. | |
| 7,302,663 B1 * | 11/2007 | Gan | G06F 30/30 716/112 |
| 8,341,560 B2 | 12/2012 | Kobayashi | |
| 8,470,705 B2 | 6/2013 | Weng et al. | |
| 9,490,245 B1 * | 11/2016 | Sahu | H01L 27/0262 |
| 10,566,277 B2 | 2/2020 | Kuesel | |
| 2014/0159157 A1 * | 6/2014 | Jensen | H01L 27/0207 438/294 |
| 2018/0225230 A1 * | 8/2018 | Litichever | G06F 21/82 |
| 2020/0050731 A1 * | 2/2020 | Yu | G06F 30/36 |

\* cited by examiner

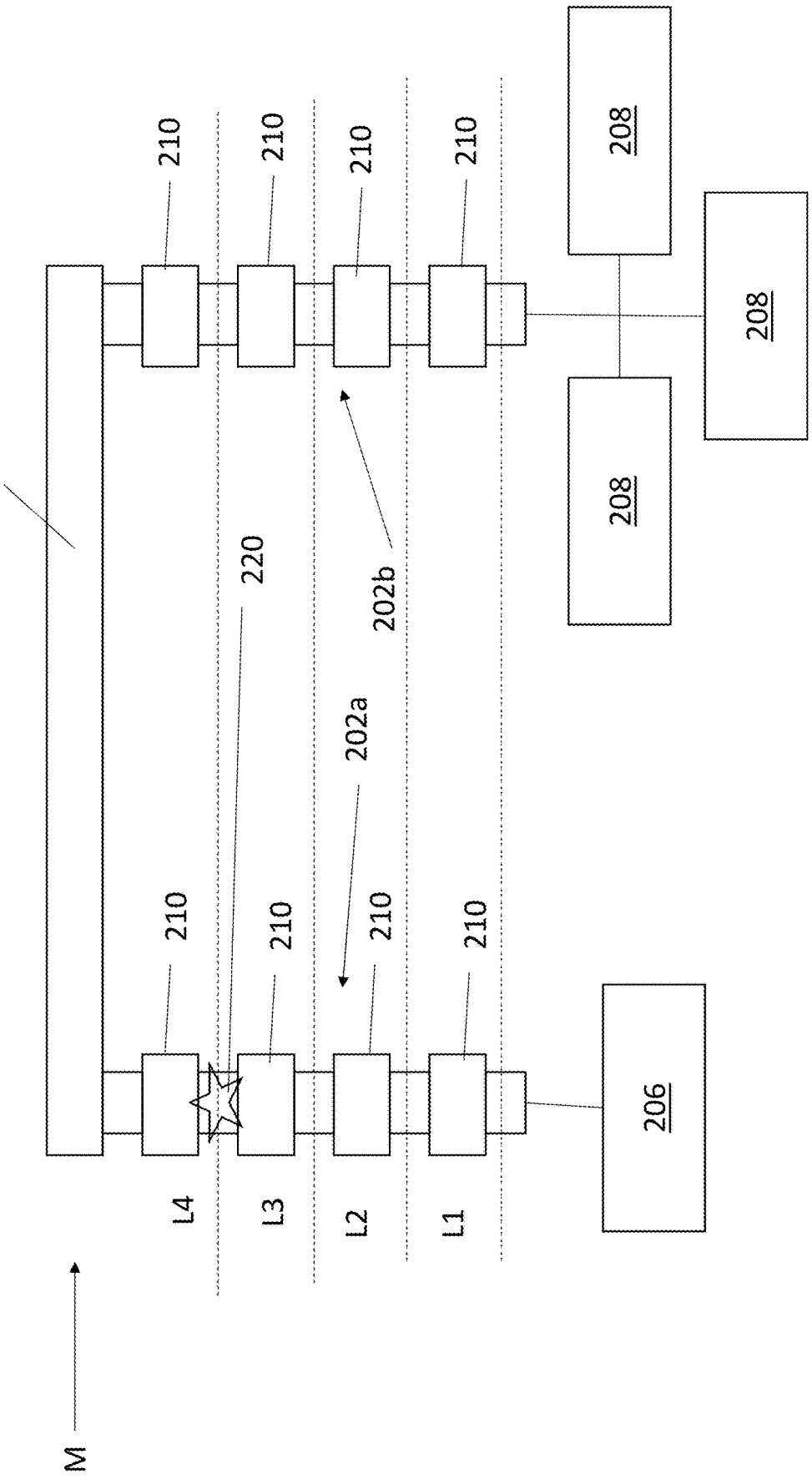

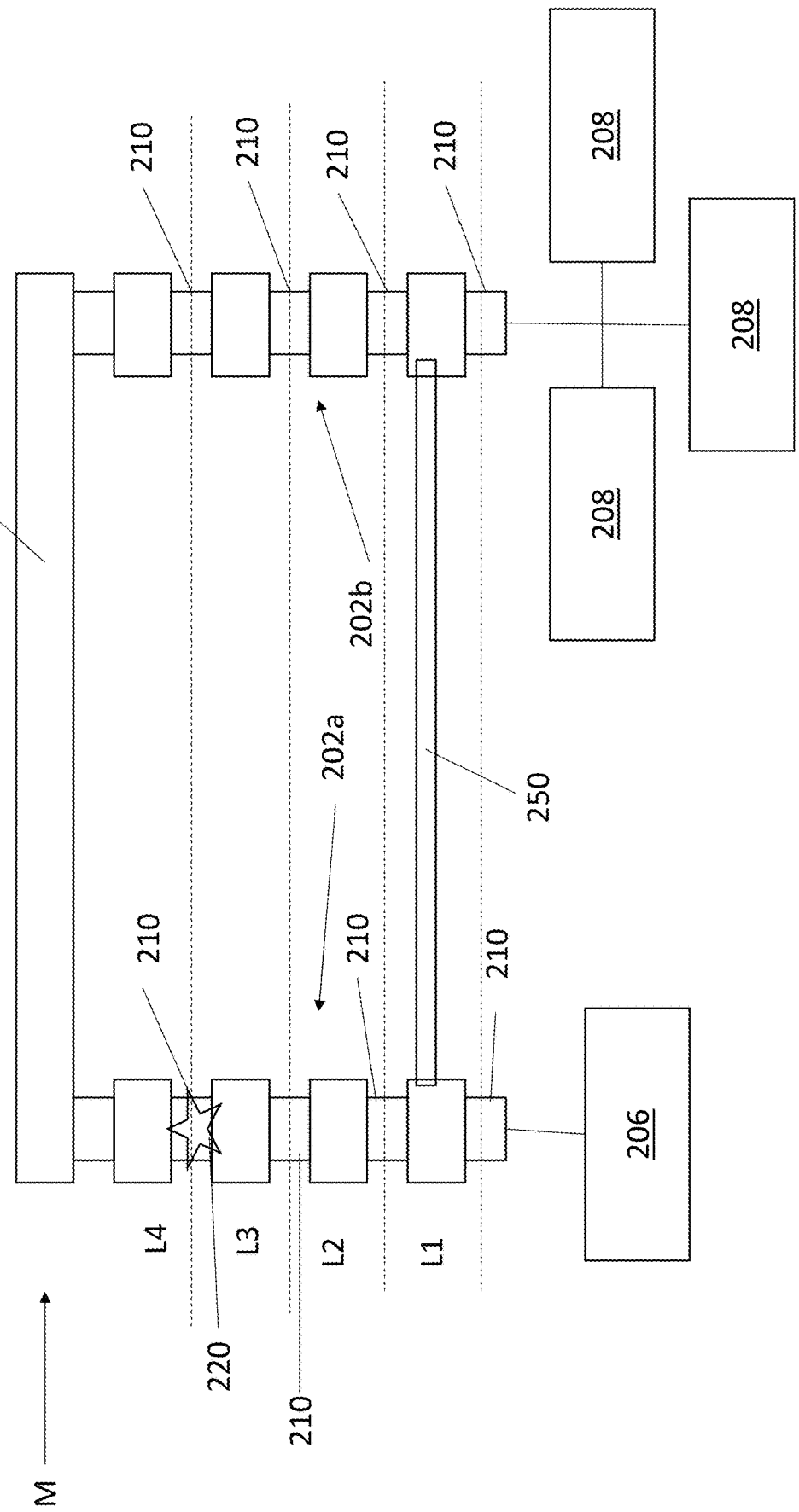

METHOD TO CURE ANTENNA VIOLATIONS IN CLOCK NETWORK USING JUMPERS

BACKGROUND

The present invention generally relates to integrated circuit development, and more specifically, to integrated circuit development that correct antenna violations in a mesh clock via Jumpers.

A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. Cell placement in semiconductor fabrication involves a determination of where particular cells should optimally (or near-optimally) be located on an integrated circuit device. While various techniques provide adequate placement of cells with regard to their data interconnections, design consideration must also be given to constructing a clock network for the cells, which require a large amount of power. Designing and implementing the clock network is a complicated process that involves clock topology construction, clock buffer insertion, local clock buffer and latch placements to meet the power, variation, and timing goals.

One issue that can arise in the design of clock network or mesh, can come not on the design itself but, rather, be created by processing required to create the IC. A particular example of such an issue is the so-called "antenna-effect." The antenna effect (also referred to plasma induced gate oxide damage) occurs during processing due to charge accumulation cause in isolated nodes of an IC. The accumulation is due to the plasma etching used to remove oxide layers (or other layers) and can cause unwanted damage through/to the gate of a transistor in the IC.

To avoid such problems, antenna rules can be applied that are based on ratios of certain metals in particular areas. If a violation of such a rule is discovered, there are different approaches that have been employed in the past. For example, long metal connections to the gate can be taken to higher metal routing layers or via-areas can be reduced. Further, in some cases, diodes that help dissipate charges accumulated on metal connected to the gate can be placed near the gate to provide a discharge path for the static charge present on the metal. The metal can be, for example, an interconnect or a via to name a few.

SUMMARY

Embodiments of the present invention are directed to integrated circuit development that does not utilize diodes to cure antenna violations.

A non-limiting example computer-implemented method includes a method for curing antenna violations on an integrated circuit that includes multiple levels. The method includes: obtaining a design of a circuit, the design including a first element connected to first device and a second element connected to one or more second devices, wherein the first and second elements both receive a common signal; determining that an antenna violation exists in on the first element at a first level of the multiple levels; and modifying the design of the circuit to add a connected between the first element and the second element at the first layer or at a layer below the first layer.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2a-2d show side-views of connected vias and illustrate how an antenna violation may be cured using jumpers as disclosed herein;

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, integrated circuit development may involve several stages from design through fabrication. As also noted, at one or more stages, the integrated circuit design may be subdivided hierarchically for design or testing tasks. One commonly manually performed design task is correction of antenna violations. A drawback of manually performing this task is that the routing topology may be unknown and, even if known, it is subject to change over time.

In one embodiment, antenna violations can be resolved by physically connecting the location of the violation to an area of silicon on the IC that does not have a violation. This can have the beneficial result of effectively increasing the gate silicon area without adding to the gate itself or having to reconfigure wiring. The connection can be made, for example, by connecting two vias that both receive the same signal (e.g., are connected to one another) at a level at or below the level where the violation occurs.

Accordingly, embodiments include a method to solve antenna violations by making connections on layers below a failing metal/via layer to areas that have the ability to safely dissipate the accumulated charge. For example, this can be accomplished by connecting the location of the violation to another via that has multiple devices conducted to it so that it can dissipate through multiple gates or silicon areas. This spreads the discharge and can reduce the possibility that damage occurs and, thereby, cure the antenna violation. Stated differently, jumpering two already connected elements (e.g. via stacks) with an additional connection from one via stack to another via stack increases the gate/rx attached to the combined metal/via area and therefore may improve the overall metal/via area to connected gate or silicon area ratio. This can be done, on one embodiment, without utilizing a diode. By not using diodes, violations can be fixed late in the design cycle without need for long reroute times.

Figure 1:
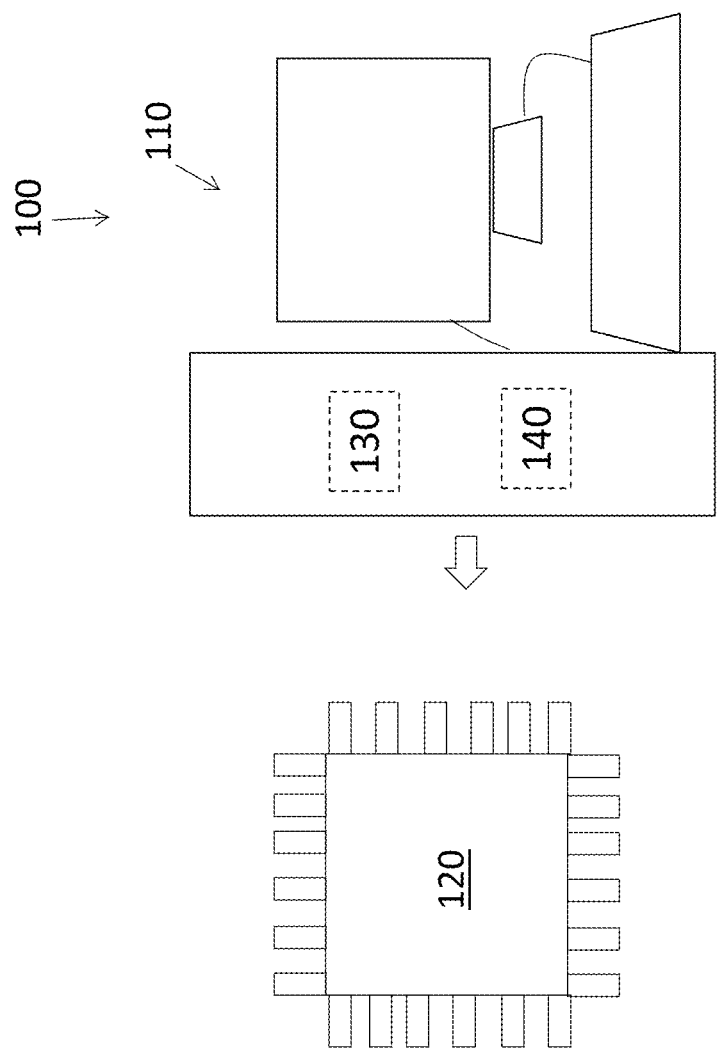
FIG. 1 is a block diagram of a system to perform the development of an integrated circuit using jumpers to cure antenna violations in an IC according to one or more embodiments of the invention.

FIG. 1 is a block diagram of a system 100 to determine where to put the connections (jumpers) according to embodiments of the invention to solve antenna violations in a clock network. The system 100 includes processing circuitry 110 used to generate the design that is ultimately fabricated into an integrated circuit 120. The steps involved in the fabrication of the integrated circuit 120 are well-known and briefly described herein.

After the physical layout is finalized, based, in part, on antenna violation analysis us performed to determine if an antenna violation exists.

Herein it shall be understood that many different ways to determine if an antenna violation exists. The methods to determine if a violation exist can include applying rules. Such rules can include, but are not limited to: a "metal area antenna rule" where that imposes a maximum limit on the ratio of the metal line area to the connected gates area, a "perimeter antenna rule" that imposes a maximum limit on the ratio of the metal line perimeter connected gates area and a via or contact area rule that imposes a maximum limit to the ratio of the via or contact area to the connected gates area.

Herein disclosed is a new solution to solving/curing antenna violations that includes inserting jumpers from higher levels that include a violation to lower layers that do not. After the jumper location are determined/added to the layout according to embodiments of the invention facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch.

FIG. 2a shows an example of a semiconductor structure 200 that includes two via stacks 202a and 202b. The vias 202a/202b are interconnected on an input metallization layer referred to as M in FIG. 2a by a metal interconnect 204. The vias 202a/202b can be part of a clock mesh or clock network in one embodiment. As shown, any signal provided on the interconnect 204 will be provided on both via stacks 202a/202b. Thus, in the case of the clock mesh or clock network the vias can be used to provide a high-level clock signal to one or more devices (shown as local clock buffers 206 or clock latches 208 such as flip-flops). It shall be understood that each of these elements can include one or more gates that are electrically connected to a respective via stack 202a, 202b.

As illustrated, each via stack 202a, 202b is formed of a series of interconnected vias 210. The vias pass through each layer and connect metal on that layer to a metal on another layer in a semiconductor device as is known in the art. As shown in FIG. 2a, the device includes layers 4-1 illustrated as L4-L1. It shall be noted that these designations are given by way of example and for ease of explanation and not meant to limit the size or configuration of this disclosure.

Information (e.g., a clock signal) provided on interconnect 204 will traverse through the respective via stacks from layer L4 to L1 to the gates of a devices in the local clock buffers 206 or clock latches 208 connected to them. As shown, a first device (local clock buffer 206 in this non-limiting example) is connected to the first via stack 202a. As shown, there is only one first device 206 connected to the first via stack 202a. In this example it shall be assumed that the first device 206 has first amount of silicon through which the above disclosed charges created by plasma can dissipate.

As shown, a second devices (a plurality of latches 208 in this non-limiting example) is connected to the second via stack 202b. As shown, there are multiple second devices 208 connected to the second via stack 202b but the second device could be formed of more devices or could be a single element or could have more element.

Similarly, the multiple second devices 208 have a combined second amount of silicon which the above disclosed charges created by plasma can dissipate. In embodiments herein, the second amount is greater than the first amount. This can be either due to there being more silicon on one second device or the fact that there are more second devices than first devices or both.

Consider that case where an antenna error (represented by element 220) could occur, for example on level L3. In the case of the first via stack 202a, the charge can only dissipate through one device while for the second via stack 202b, the charge can dissipate through three devices.

Given that the amount of silicon (or number of gates) in three devices 208 is greater than that in the single device 206, connecting the via 210 at L3 in the first via stack 202a to the via 210 on L3 in the second via stack 202b creates a scenario that can possibly cure the antenna violation.

Figure 2B:
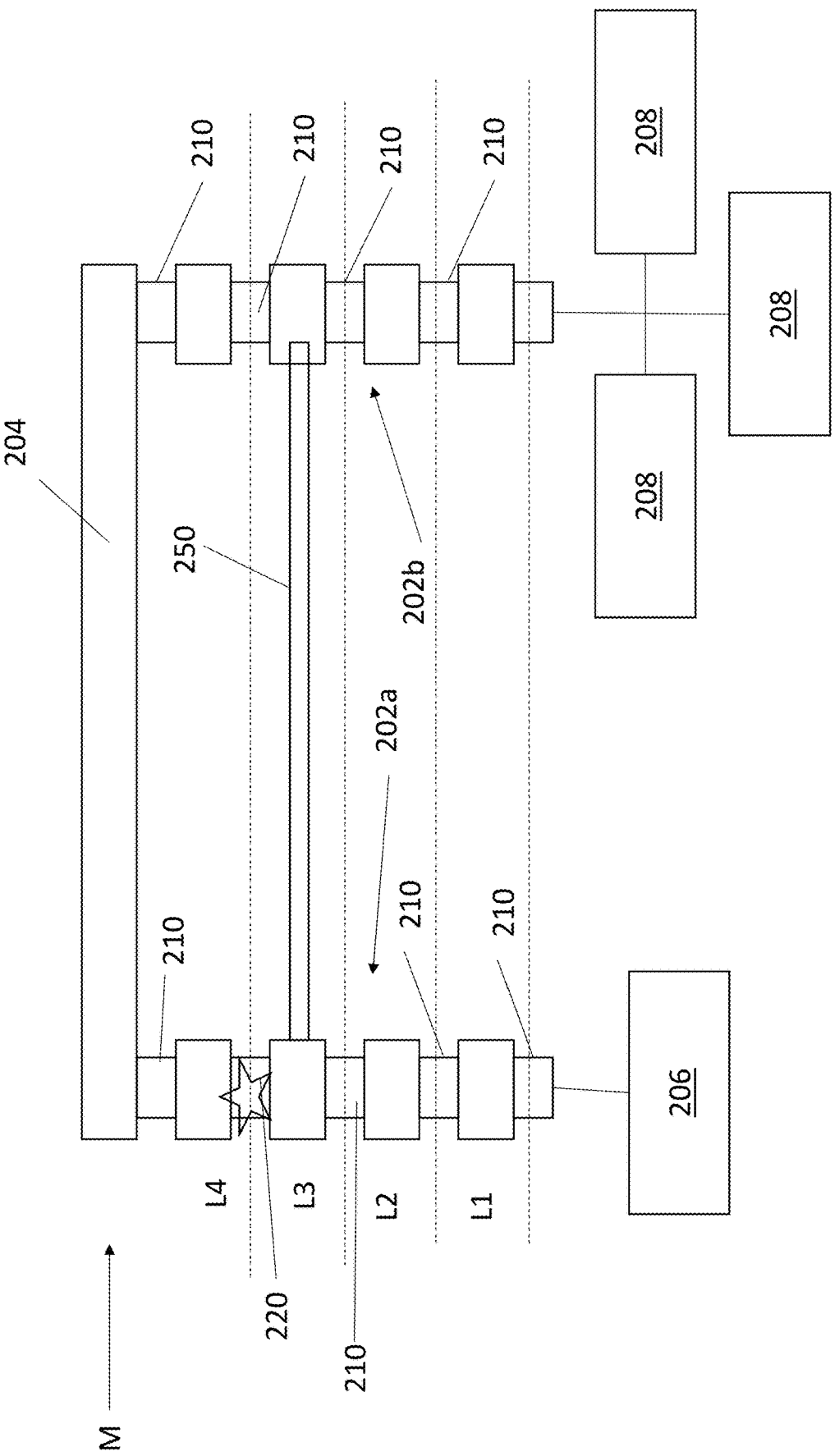
Figure 2D:
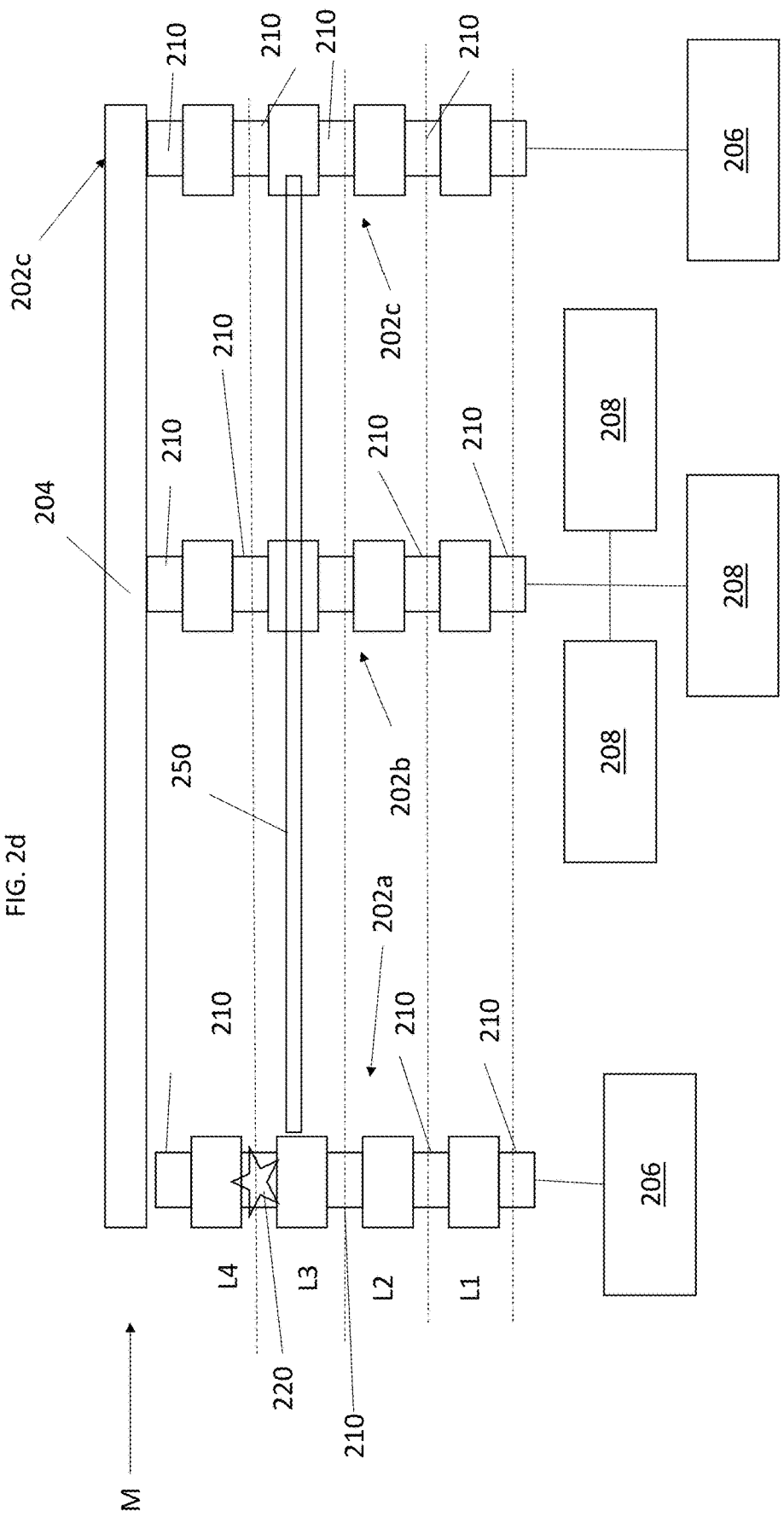

In one embodiment, the connection 250 can be at the same level as shown in FIG. 2b or at a lower level as shown in FIG. 2c. The connection 250 can be formed of metal. Of course, when optimizing, this added metal may be accounted for to ensure it does not create additional antenna violations. Further, as shown in FIG. 2d, in some instances, the connection (jumper) 250 can connect the via with violation to more than other connected via (202c) to further distribute the paths for dissipation to cure an antenna violation.

Figure 3:
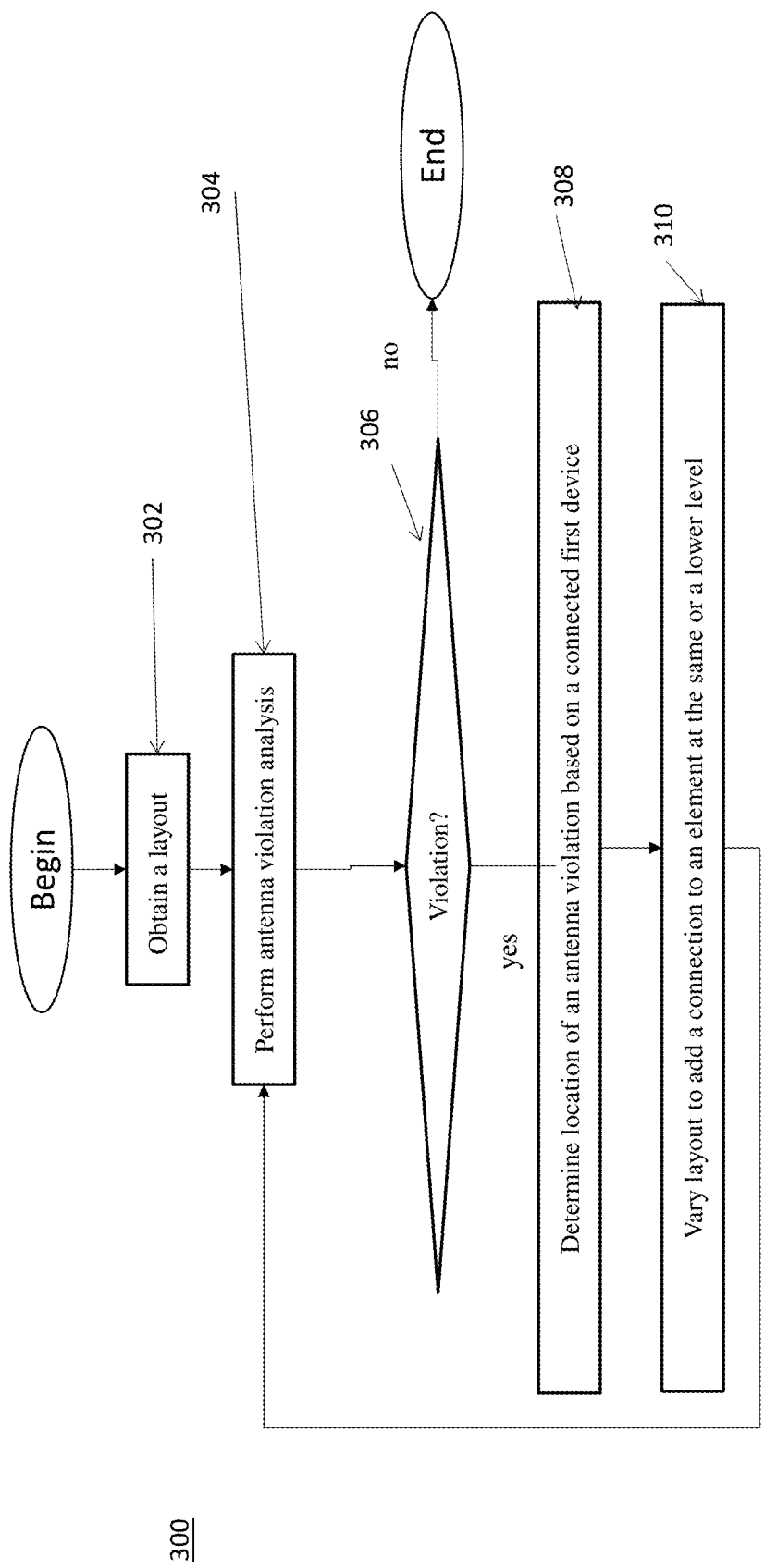
FIG. 3 is a process flow of a method of curing antenna violations according to one embodiment.

FIG. 3 is a process flow of a method 300 of curing antenna violations according to exemplary embodiments of the invention.

The method 300 begins at block 302 by obtaining a layout for an integrated circuit. The layout can be for clock network or clock mesh in one embodiment and include vias and clock elements as discussed above, for example.

Next, as shown at block 304 the method 300 includes performing an antenna violation analysis on the layout. This analysis can any known or later developed computer or human performed analysis method. The analyses can include determining a location where violation occurs. This determination can include, for example, determining the level where the violation occurs. This analysis can also include recording locations of the violations and the number/type of first devices connected to the location. For example, it could include determining that a single clock buffer is connected to via.

After the analysis is completed, if there is no violation as determined at block 306, the process ends. If, however a violation occurs, processing proceeds to block 308.

As indicated at block 308, the method 300 also includes adding a jumper in the layout to an element (e.g., a via) that is connected to a same input signal (e.g. a clock signal) as the location of the antenna error. The jumper can connect to a one more other locations. The other location can be connected to so called "second devices."

Processing the returns to block 304 to confirm that the added jumpers cure the violations. If so, the process ends. Otherwise, the processing in blocks 308/310 can be repeated.

Figure 4:
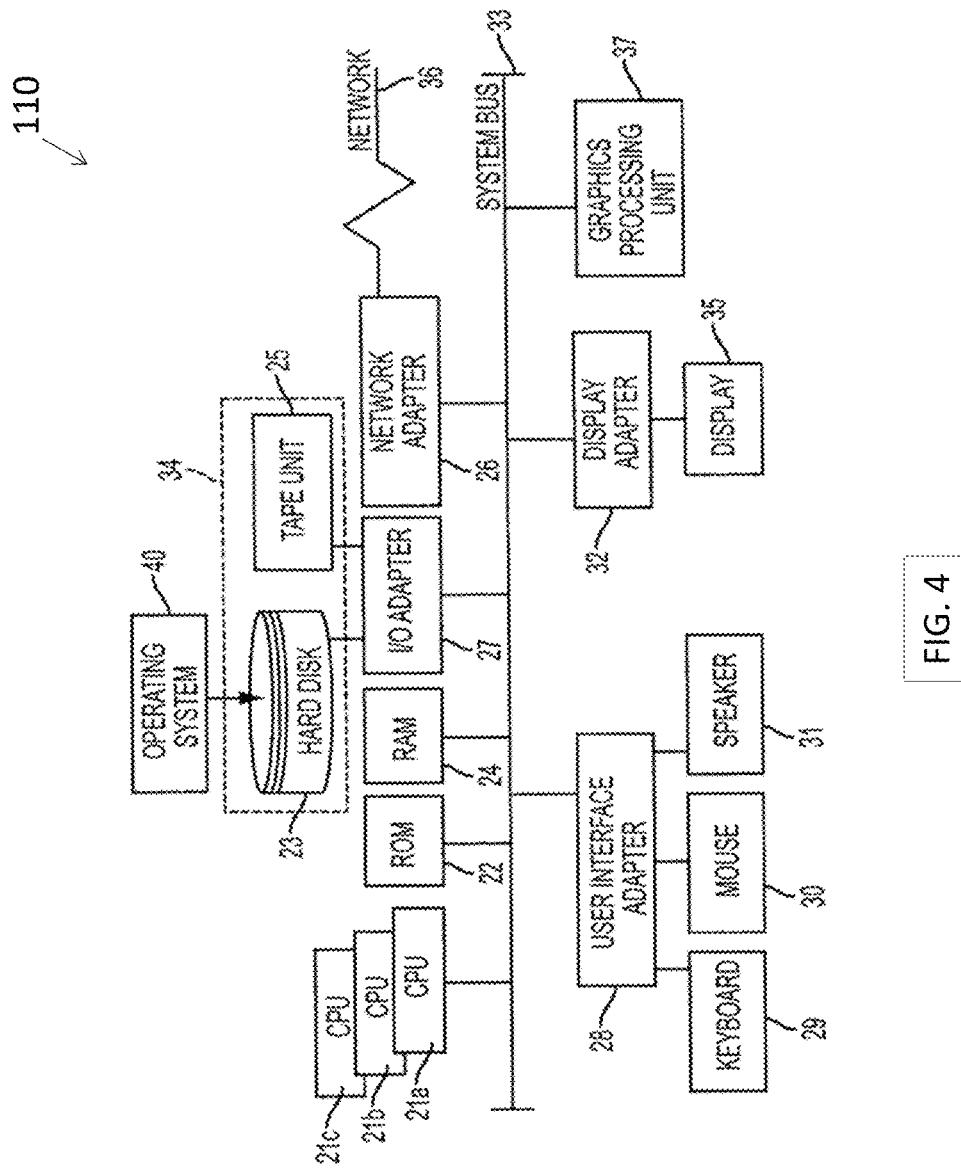
FIG. 4 is a block diagram of a processing system to generate the design that is fabricated into the integrated circuit according to one or more embodiments of the invention.

FIG. 4 is a block diagram of a processing system 110 used to generate the design that is fabricated into the integrated circuit 120. The processing system 110 has one or more central processing units (processors) 21*a*, 21*b*, 21*c*, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of processing system 110.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 110 can be stored in mass storage 34. The RAM 22, ROM 24, and mass storage 34 are examples of memory 19 of the processing system 110. A network adapter 26 interconnects system bus 33 with an outside network 36 enabling the processing system 110 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, processing system 110 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, processing system 110 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in the processing system 110.

Figure 5:
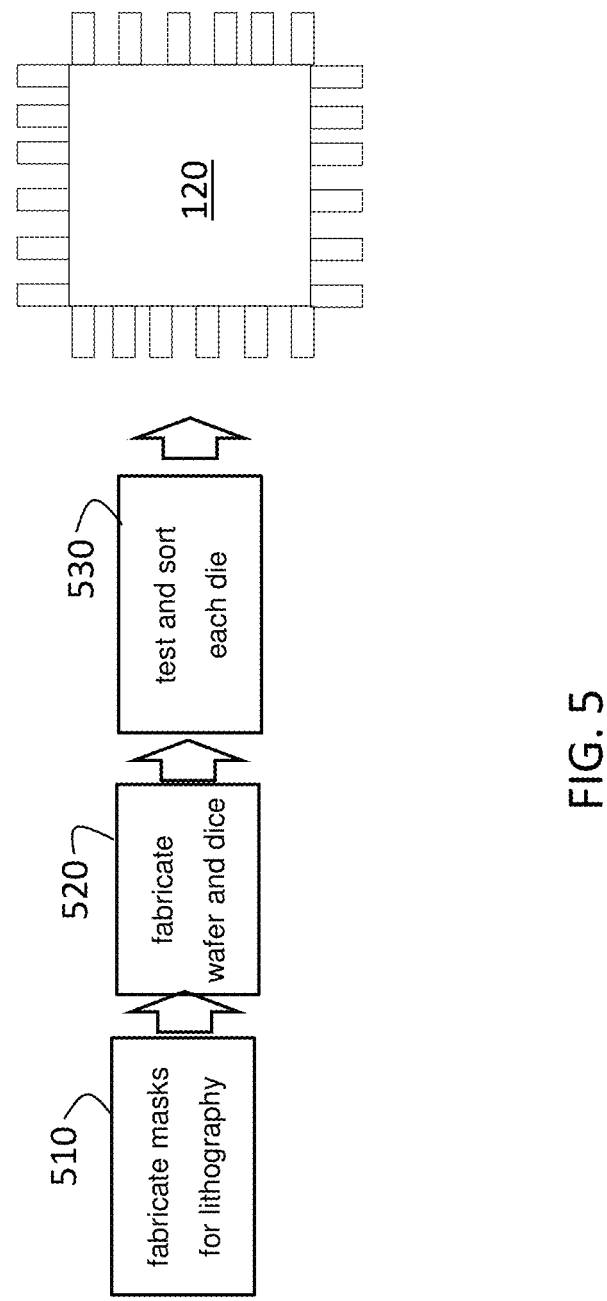
FIG. 5 is a process flow of a method of fabricating the integrated circuit according to exemplary embodiments of the invention.

FIG. 5 is a process flow of a method 500 of fabricating the integrated circuit according to exemplary embodiments of the invention. Once the physical design data is obtained, based, in part, on the processes discussed with reference to FIG. 4, the integrated circuit 120 can be fabricated according to known processes that are generally described with reference to FIG. 5. Generally, a wafer with multiple copies of the final design is fabricated and cut (i.e., diced) such that each die is one copy of the integrated circuit 120. At block 510, the processes include fabricating masks for lithography based on the finalized physical layout. At block 520, fabricating the wafer includes using the masks to perform photolithography and etching. Once the wafer is diced, testing and sorting each die is performed, at block 530, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for curing antenna violations on an integrated circuit that includes multiple levels, the method comprising:
    obtaining a design of a circuit, the design including multiple levels including a first level and a second level, a first element at the first level connected to a first device and a second element located on the second level connected to one or more second devices, wherein the first and second elements both receive a common clock signal, wherein the first device can discharge a first amount of a plasma induced charge and the one or more second device can discharge a second amount of plasma induced charge that is greater than the first amount;
    determining that an antenna violation exists on the first level at the first element; and
    modifying the design of the circuit to add a diode-less jumper connection between the first element and the second element so that the first device can discharge charge through the second device and cure the clock violation;
    wherein the second level is below the first level.

2. The method of claim 1, wherein the first element is a via.

3. The method of claim 2, wherein the second element is a metallization layer.

4. The method of claim 2, wherein the second element is a via.

5. The method of claim 1, wherein the first element is a metallization layer and the second element is one of via or another metallization layer.

6. The method of claim 1, wherein the integrated circuit is clock network and the common signal is clock signal.

7. The method of 6, wherein the first device is one of a local clock buffer or a latch.

8. A system comprising:
    a memory having computer readable instructions; and
    one or more processors for executing the computer readable instructions, the computer readable instructions controlling the one or more processors to perform operations for curing antenna violations on an integrated circuit that includes multiple levels comprising:
    obtaining a design of a circuit, the design including multiple levels including a first level and a second level, a first element at the first level connected to a first device and a second element located on the second level connected to one or more second devices, wherein the first and second elements both receive a common clock signal, wherein the first device can discharge a first amount of a plasma induced charge and the one or more second device can discharge a second amount of plasma induced charge that is greater than the first amount;
    determining that an antenna violation exists on the first level at the first element; and
    modifying the design of the circuit to add a diode-less jumper connection between the first element and the second element so that the first device can discharge charge through the second device and cure the clock violation;

wherein the second level is below the first level.

9. The system of claim 8, wherein the first element is a via.

10. The system of claim 8, wherein the second element is a metallization layer or a via.

11. The system of claim 8, wherein the integrated circuit is clock network and the common signal is clock signal.

12. The system of claim 10, wherein the first device is one of a local clock buffer or a latch.

13. A computer program product comprising a computer readable storage medium having program instructions embodied therewith, the program instructions executable by a processor to cause the processor to perform the method of claim 1.

\* \* \* \* \*